(12) United States Patent
Kim

(10) Patent No.: US 10,665,653 B2
(45) Date of Patent: May 26, 2020

(54) ORGANIC LIGHT EMITTING DISPLAY APPARATUS

(71) Applicant: LG Display Co., Ltd., Seoul (KR)

(72) Inventor: Eunah Kim, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/135,849

(22) Filed: Sep. 19, 2018

(65) Prior Publication Data

US 2019/0096974 A1 Mar. 28, 2019

(30) Foreign Application Priority Data

Sep. 28, 2017 (KR) .................. 10-2017-0125723

(51) Int. Cl.
*H01L 27/32* (2006.01)
*H01L 51/00* (2006.01)
*H01L 51/52* (2006.01)

(52) U.S. Cl.
CPC ...... *H01L 27/3258* (2013.01); *H01L 27/3246* (2013.01); *H01L 27/3276* (2013.01); *H01L 51/0097* (2013.01); *H01L 51/5237* (2013.01); *H01L 51/5253* (2013.01); *H01L 51/5284* (2013.01); *H01L 2251/5315* (2013.01)

(58) Field of Classification Search
CPC ..... H01L 27/1214–1296; H01L 27/124; H01L 27/1255; H01L 27/32–3293; H01L 27/3297; H01L 27/3258; H01L 27/3246; H01L 27/3276; H01L 51/0097; H01L 51/50; H01L 2227/32; H01L 2251/50; H01L 2251/5338; H01L 2251/568; H01L 2251/5315; H01L 2924/12044; H01L 2924/3512; H01L 2924/3511; H01L 2924/351; H01L 2924/386; H01L 51/5237; H01L 51/5284; H01L 51/5253; G09G 3/006; G09G 2330/12; G09G 2330/0426; G09G 2330/0452
USPC ...... 257/40, 48, 59, 88, 89, E23.01; 438/30, 438/34
See application file for complete search history.

(56) References Cited

U.S. PATENT DOCUMENTS

2012/0146886 A1* 6/2012 Minami ............... H01L 27/3276 345/80
2014/0117336 A1* 5/2014 Kim .................... H01L 51/5246 257/40
2017/0125505 A1* 5/2017 Oh ........................ H01L 51/52

FOREIGN PATENT DOCUMENTS

KR 10-2014-0129647 A 11/2014
KR 20140129647 A * 11/2014 ............. H01L 51/50

* cited by examiner

*Primary Examiner* — Natalia A Gondarenko
(74) *Attorney, Agent, or Firm* — Birch, Stewart, Kolasch & Birch, LLP

(57) ABSTRACT

An organic light emitting display apparatus can include a substrate including a display area and a bending area; a pixel array layer including a driving wiring in the display area, and a thin film transistor electrically connected to the driving wiring; a planarization layer covering the pixel array layer; a light emitting device layer disposed on the planarization layer, the light emitting device layer being electrically connected to the thin film transistor; a routing wiring disposed in the bending area, the routing wiring being electrically connected to the driving wiring; a wiring contact part including a contact hole for electrically connecting the driving wiring to the routing wiring; and an encapsulation layer covering the light emitting device layer and the wiring contact part.

20 Claims, 4 Drawing Sheets

ORGANIC LIGHT EMITTING DISPLAY APPARATUS

CROSS-REFERENCE TO RELATED APPLICATIONS

This application claims the priority benefit of the Korean Patent Application No. 10-2017-0125723 filed in the Republic of Korea on Sep. 28, 2017, the entirety of which is hereby incorporated by reference as if fully set forth herein.

BACKGROUND

Field of the Invention

The present disclosure relates to an organic light emitting display apparatus.

Discussion of the Related Art

With the advancement of an information-oriented society, various requirements for display apparatuses for displaying an image are increasing. Organic light emitting display apparatuses, which are self-emitting display apparatuses, have a wide viewing angle, an excellent contrast, and a fast response time, and thus, are attracting much attention as next-generation display apparatuses. Recently, organic light emitting display apparatuses are being released, which are even slimmer. Flexible organic light emitting display apparatuses are easy to carry and may be applied to various image display apparatuses.

Flexible organic light emitting display apparatuses each include a bending area which enables a substrate to be folded. Since the substrate is folded in the bending area, a bezel size is reduced, and thus, organic light emitting display apparatuses having a narrow bezel may be implemented.

However, as a degree of bending increases for realizing a more narrow bezel, a crack occurs in a routing wiring disposed in the bending area, causing a short circuit.

SUMMARY

Accordingly, the present disclosure is directed to an organic light emitting display apparatus that substantially obviates one or more problems due to limitations and disadvantages of the related art.

An aspect of the present disclosure is directed to an organic light emitting display apparatus which minimizes or prevents a crack at a routing wiring to enable easy bending, thereby protecting a light emitting device from permeation of external water or moisture.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus including a substrate including a display area and a bending area, a pixel array layer including a driving wiring, including a gate line and a data line disposed in the display area, and a thin film transistor connected to the driving wiring, a planarization layer covering the pixel array layer, a light emitting device layer provided on the planarization layer and connected to the thin film transistor, a routing wiring disposed in the bending area and connected to the driving wiring, a wiring contact part including a contact hole electrically connecting the driving wiring to the routing wiring, and an encapsulation layer covering the light emitting device layer and the wiring contact part.

Both the foregoing general description and the following detailed description of the present disclosure are explanatory and are intended to provide examples and further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Figure 1:
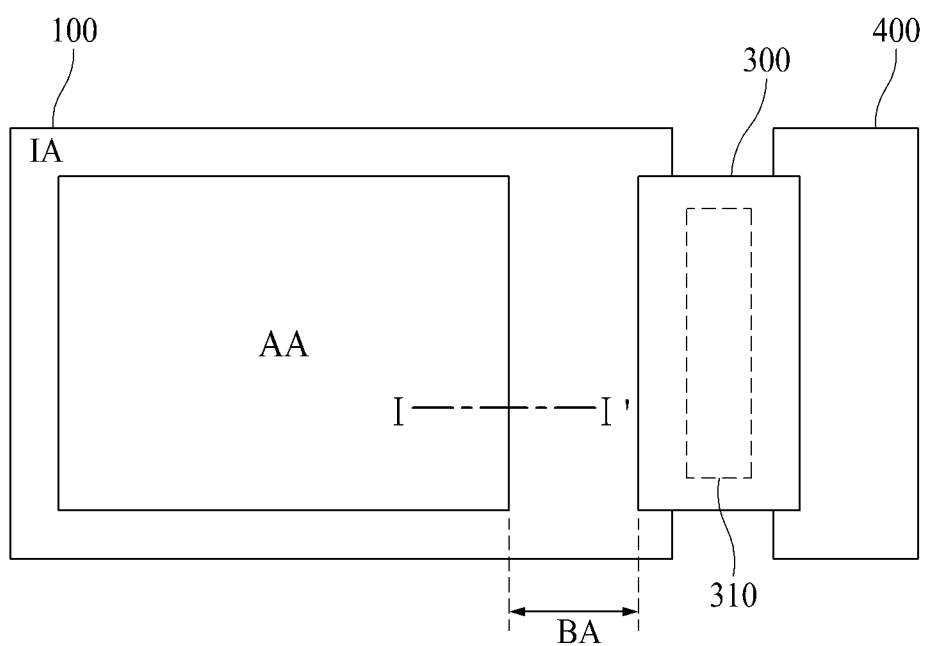
FIG. 1 is a plan view illustrating an organic light emitting display apparatus according to an embodiment of the present disclosure.

Reference will now be made in detail to embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by the scopes of the claims.

A shape, a size, a ratio, an angle, and a number disclosed in the drawings illustrating embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," "have," and "include described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless "just" or "direct" is used.

In describing a time relationship, for example, when the temporal order is described as "after," "subsequent," "next," and "before," a situation which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The phrase "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure may be performed independently from each other, or may be performed together in co-dependent relationship.

Hereinafter, example embodiments of an organic light emitting display apparatus according to an embodiment of the present disclosure will be described in detail with reference to the accompanying drawings. In the specification, in adding reference numerals for elements in each drawing, it should be noted that like reference numerals already used to denote like elements in other drawings are used for elements wherever possible.

FIG. 1 is a plan view illustrating an organic light emitting display apparatus according to an embodiment of the present disclosure.

Referring to FIG. 1, the organic light emitting display apparatus according to an embodiment of the present disclosure can include a substrate 100, a driver 300, and a circuit board 400.

The substrate 100, as for a thin film transistor (TFT) array substrate, can be formed of glass, plastic, semiconductor and/or the like. The substrate 100 according to an embodiment can include a display area AA and a non-display area IA.

The display area AA can be provided in a portion of the substrate 100, except for an edge of the substrate 100 (e.g., not along the outer edges). The display area AA can be defined as an area which displays an image.

The non-display area IA can be provided in the other portion except for the display area AA provided on the substrate 100 and can be defined as an edge of the substrate 100 surrounding the display area AA. The non-display area IA can be a peripheral area outside the display area AA and may not display an image unlike the display area AA. Also, the non-display area IA can include a bending area BA connected to the driver 300.

The bending area BA can be an area disposed in the non-display area IA and can be an area where a routing wiring is disposed, which connects the driver 300 to the display area AA. The bending area BA can be an area which is provided in order for a portion of the non-display area IA to be folded in one direction, and causes a reduction of the bezel area of the organic light emitting display apparatus according embodiments of the present disclosure.

The driver 300 can be connected to a pad part provided in the non-display area IA of the substrate 100 for displaying an image, corresponding to video data supplied from a display driving system, on the display area AA. The driver 300 according to an embodiment can include a driving circuit 310 and can have a chip-on film (COF) structure. For example, the driver 300 can include a flexible film, a driving integrated circuit (IC) disposed on the flexible film, and a plurality of driving terminals disposed in one edge of the flexible film.

The circuit board 400 can be electrically connected to the driver 300. The circuit board 400, according to an embodiment, can transfer signals and power between elements of the driver 300. The circuit board 400 can be a printed circuit board (PCB) having flexibility.

Figure 2:
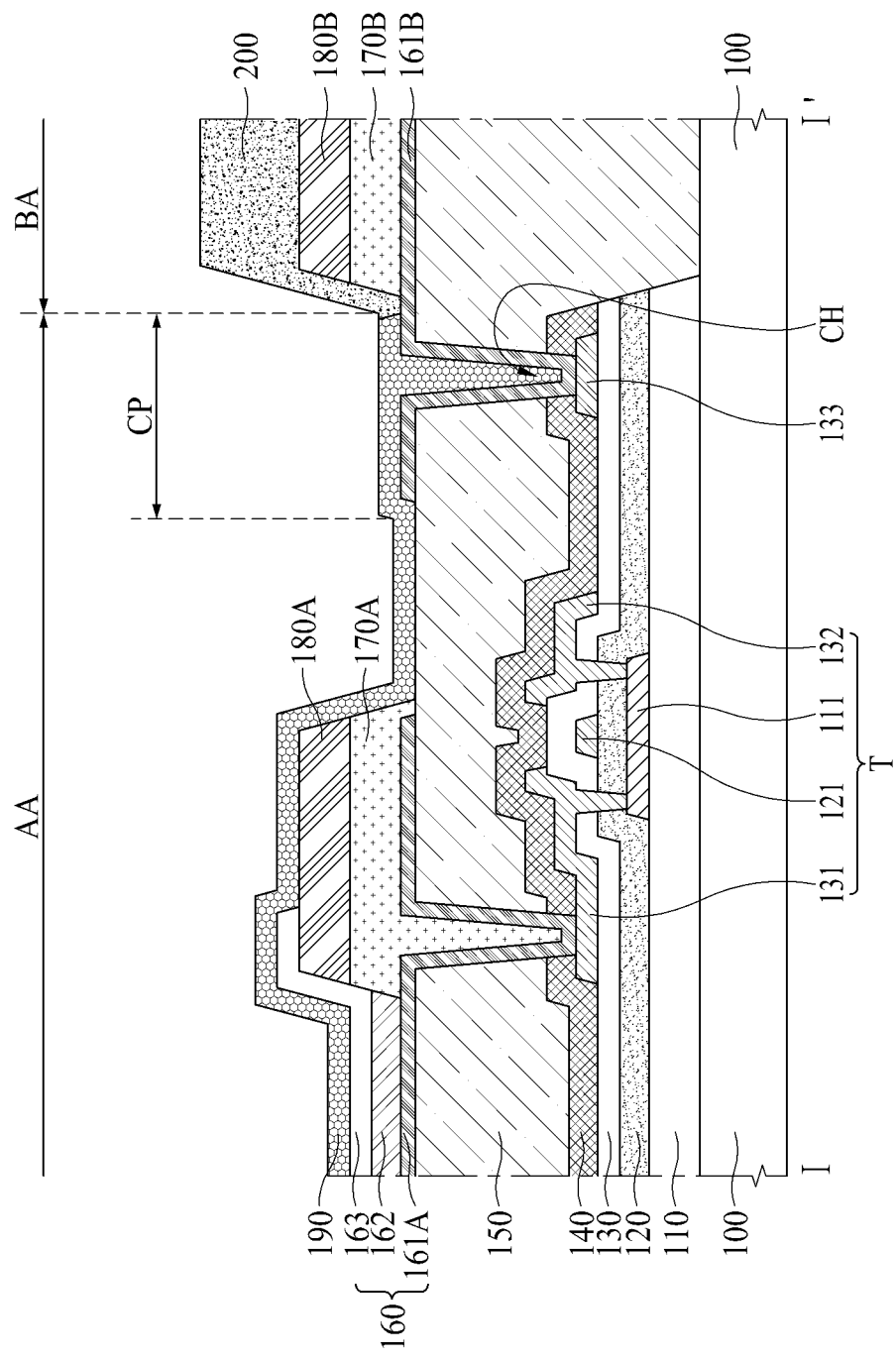
FIG. 2 is a cross-sectional view, taken along line I-I' of FIG. 1, illustrating an organic light emitting display apparatus according to an embodiment of the present disclosure.

FIG. 2 is a cross-sectional view, taken along line I-I' of FIG. 1, of an organic light emitting display apparatus according to a first embodiment of the present disclosure.

Referring to FIG. 2, the organic light emitting display apparatus according to the present embodiment can include a substrate 100, a buffer layer 110, a pixel array layer, a planarization layer 150, a light emitting device layer 160, a plurality of banks 170A and 170B, a plurality of spacers 180A and 180B, an encapsulation layer 190, a routing wiring 161B, a coating layer 200, and a contact hole CH.

The substrate 100, e.g., a TFT array substrate, can be formed of glass, plastic, semiconductor and/or the like. The substrate 100 according to an embodiment can include a display area AA and a non-display area IA.

The buffer layer 110 can be provided in the display area AA of the substrate 100. The buffer layer 110 according to an embodiment prevents water or moisture from permeating into the pixel array layer. The buffer layer 110 can be formed of an inorganic insulating material, and for example, can be formed of silicon dioxide ($SiO_2$), silicon nitride ($SiNx$), or a multilayer thereof, but is not limited thereto.

The pixel array layer can be provided on the buffer layer 110. The pixel array layer can include a thin film transistor T, a driving wiring 133, and an interlayer insulation layer 140.

The thin film transistor T can be provided on the buffer layer 110. The thin film transistor T according to an embodiment can control the amount of current flowing from the driver 300 to the light emitting device layer 160. The thin film transistor T can include a semiconductor layer 111, a gate electrode 121, a source electrode 131, and a drain electrode 132.

The semiconductor layer 111 can be provided on the buffer layer 110. The semiconductor layer 111 can include a semiconductor material including one of amorphous silicon, polycrystalline silicon, oxide material, and an organic material, but is not limited thereto.

The gate electrode 121 can be formed on a semiconductor insulation layer 120 along with a gate line. The gate electrode 121 can be covered by a gate insulation layer 130.

The source electrode 131 can be provided on one side of the gate insulation layer 130 to overlap one side of the semiconductor layer 111. The source electrode 131 can be formed along with a data line and a driving power line.

The drain electrode 132 can be provided on the other side of the gate insulation layer 130 to overlap the other side of the semiconductor layer 111 and can be spaced apart from the source electrode 131. The drain electrode 132 can be formed along with the source electrode 131 and can branch or protrude from an adjacent driving power line (or data line).

The driving wiring 133 can include a gate line and a data line which intersect each other to define a pixel. Also, the driving wiring 133 can further include a driving power line provided adjacent to the data line.

The gate line can be provided on the semiconductor insulation layer 120 which is provided on the same layer as the gate electrode 121. That is, the semiconductor insulation layer 120 can be disposed between the substrate 100 and the gate line.

The data line or the driving power line, as illustrated in FIG. 2, may be provided on the same layer as the source electrode 131 and the drain electrode 132 on the gate insulation layer 130. That is, the gate insulation layer 130 may be disposed between the gate line and the data line.

The gate line according to an embodiment can be formed of the same material as that of the gate electrode 121, and the data line and the driving power line can be formed of the same material as that of each of the source electrode 131 and the drain electrode 132. Therefore, the driving wiring 133 can be formed of the same material as that of one of or all of the gate electrode 121, the source electrode 131, and the drain electrode 132.

The interlayer insulation layer 140 can be provided on the source electrode 131, the drain electrode 132, and the driving wiring 133. The interlayer insulation layer 140 can insulate the thin film transistor T from the outside and protect the thin film transistor T from a chemical material, water, and gases in a manufacturing process. The interlayer insulation layer 140 can be formed of an inorganic material which is low in conductive and flexible characteristics, or can be formed of an inorganic material including silicon (Si). The contact hole CH electrically connecting the driving wiring 133 to the routing wiring 161B can be provided in the interlayer insulation layer 140 according to an embodiment. A detailed structure thereof will be described below.

The planarization layer 150 can be provided on the substrate 100 to cover the pixel array layer. The planarization layer 150 protects the thin film transistor T and provides a planar surface on the thin film transistor T. The planarization layer 150 according to an embodiment can be formed of an organic material, such as benzocyclobutene or photo acryl, but for convenience of a process, the planarization layer 150 can be formed of a photo acryl material.

The planarization layer 150 according to an embodiment can be provided to contact the substrate 100 in the bending area BA. That is, the planarization layer 150 can be provided in a whole region or entire area of the substrate 100. Since the buffer layer 110 and the insulation layers 120, 130, and 140 are not provided in the bending area BA of the substrate 100, according to an embodiment, the planarization layer 150 can be provided to directly contact the substrate 100. When the planarization layer 150 is formed of an organic insulating material, the planarization layer 150 can have characteristics that a degree of damage caused by stress, tension, or other external force acting in bending process is small and the flexibility is high. Therefore, since the planarization layer 150 is provided to contact the substrate 100 in the bending area BA of the substrate 100, the bending process of an organic light emitting display apparatus can be more easily and safely performed.

The light emitting device layer 160 can be provided on the planarization layer 150. The light emitting device layer 160 according to an embodiment can include a first electrode 161A, a light emitting layer 162, and a second electrode 163.

The first electrode 161A, an anode electrode, can be provided in a pattern on the planarization layer 150. The first electrode 161A according to an embodiment can be electrically connected to the source electrode 131 of the thin film transistor T through a contact hole provided in the planarization layer 150 and receive a data current output from the thin film transistor T. The first electrode 161A can be formed of a metal material having the high reflectivity, and for example, can include a material such as gold (Au), silver (Ag), aluminum (Al), molybdenum (Mo), or magnesium (Mg), or an alloy thereof, but is not limited thereto.

The light emitting layer 162 can be provided on the first electrode 161A in an opening area (or emission area) defined by a first bank 170A. The light emitting layer 162 according to an embodiment can include a hole injection layer, a hole transport layer, an organic light emitting layer, an electron transport layer, and an electron injection layer which are sequentially stacked on the first electrode 161A. Here, one or more among the hole injection layer, the hole transport layer, the electron transport layer, and the electron injection layer may be omitted. In addition, the light emitting layer 162 can further include at least one function layer for controlling an electron and/or a hole injected into the organic light emitting layer.

The second electrode 163 can be provided on the substrate 100 to cover the light emitting layer 162 and the first bank 170A and can be connected to all or some of the light emitting layers 162 formed over the whole surface of the substrate 100 in common. The second electrode 163 can be defined as a cathode electrode or a common electrode, based on a direction of a current flowing in the light emitting layer 162. The second electrode 163 can receive a cathode power supplied from the driver 300. Here, the cathode power can be a ground voltage or a direct current (DC) voltage having a certain voltage level.

The second electrode 163 according to an embodiment can be formed of a transparent metal material having a high light transmittance. For example, the second electrode 163 can include indium tin oxide (ITO), indium zinc oxide (IZO), indium zinc tin oxide (IZTO), indium cesium oxide (ICO), or indium tungsten oxide (IWO), which is a transparent conductive material such as transparent conductive oxide (TCO). Optionally, in the present embodiment, in order to minimize damage of the light emitting layer 162 caused by a process temperature in a process of forming the second electrode 163, the second electrode 163 can be formed of an amorphous transparent conductive material through a low temperature metal deposition process using a process temperature of less than 100 degrees Celsius. That is, in a situation that the second electrode 163 is formed of a crystalline transparent conductive material, there is a problem in which the light emitting layer 162 is damaged by a high temperature thermal treatment process which is performed on the second electrode 163 to ensure a low resistance value. Therefore, to address this issue, the second electrode 163 can be formed of the amorphous transparent conductive material by the low temperature metal deposition process.

The first bank 170A can be provided on the planarization layer 150 to cover an edge of the first electrode 161A and the thin film transistor T and can define an opening area. The first bank 170A according to an embodiment can include an organic material such as benzocyclobutadiene, acryl, or polyimide. Additionally, the first bank 170A can be formed of a photosensitive agent including a black pigment, and in this instance, the first bank 170A can act as a light blocking member (or a black matrix).

A first spacer 180A can be provided on the first bank 170A. The first spacer 180A can be provided for preventing a dark spot defect from occurring when a mask contacts the first electrode 161A in a process of depositing the light emitting layer 162. The mask may have a characteristic in which a center portion thereof sags, and a sagging portion may contact the first electrode 161A. The first spacer 180A according to an embodiment can be provided on the first bank 170A and can separate the sagging mask from the first electrode 161A by a certain distance so the sagging mask does not touch the first electrode 161A. Therefore, since the mask does not contact the first electrode 161A, the occurrence of a dark spot defect is prevented.

The encapsulation layer 190 can be provided on the light emitting layer 162, for preventing permeation of water or gases to protect the light emitting layer 162 vulnerable to external water or oxygen. That is, the encapsulation layer 190 can be provided in the display area AA and the non-display area IA of the substrate 100 to cover the second electrode 163. The encapsulation layer 190 according to an embodiment can be formed of an inorganic layer or an organic layer, or be formed in a multi-layer structure in which an inorganic layer and an organic layer are alternately stacked.

The encapsulation layer 190 can effectively prevent permeation of external water, and thus, can completely seal a side surface of the display area AA to protect the thin film transistor T and the light emitting device layer 160 provided in the display area AA. The encapsulation layer 190 according to an embodiment can be provided to cover a side surface of each of the first bank 170A and the first spacer 180A adjacent to a wiring contact part CP. The first bank 170A and the first spacer 180A can be disposed on a side surface of the light emitting device layer 160. Therefore, when the side surface of each of the first bank 170A and the first spacer 180A is externally exposed, external water and gases may reach the light emitting device layer 160 via the first bank 170A and the first spacer 180A. Accordingly, to address this issue, the encapsulation layer 190 can seal the side surface of each of the first bank 170A and the first spacer 180A to protect the light emitting device layer 160 from permeation of external water and gases.

The routing wiring 161B can be disposed in the bending area BA of the substrate 100. In more detail, the routing wiring 161B can be provided on the planarization layer 150 provided in the bending area BA. The routing wiring 161B according to an embodiment can electrically connect the driver 300 to the driving wiring 133 and be formed of a metal line.

The routing wiring 161B according to an embodiment can be formed of a rectilinear metal wiring to have a fine pattern, based on an ultra-high definition (UHD) mode of the organic light emitting display apparatus. Since the routing wiring 161B should send a data signal to the driving wiring 133 in a limited space, a wiring width and a wiring interval can each be set to approximately 2 μm to 4 μm.

The routing wiring 161B can be formed of the same material as that of the first electrode 161A. The routing wiring 161B can be formed in a process of depositing the first electrode 161A. That is, the routing wiring 161B and the first electrode 161A can be formed on the planarization layer 150 which is the same layer, and thus, can be simultaneously formed.

The routing wiring 161B, according to an embodiment the present disclosure, can be provided on the planarization layer 150 including an organic material which is good in adhesive force, and thus, a separate adhesive layer may not be provided. In a situation that the routing wiring 161B is formed in a process of depositing the source/drain electrode 131/132, an additional adhesive layer for strengthening an adhesive force between the substrate 100 and the routing wiring 161B can be provided between the substrate 100 and the routing wiring 161B. However, since the routing wiring 161B, according to an embodiment of the present disclosure, is provided on the planarization layer 150, an additional adhesive layer may be omitted, and thus, the number of masks is reduced in a manufacturing process.

A second bank 170B can be provided on the routing wiring 161B. The second bank 170B according to an embodiment can be formed of the same organic material as that of the first bank 170A and can be patterned and formed in a deposition process of forming the first bank 170A. The second bank 170B can be formed of a material for preventing permeation of water and can protect the routing wiring 161B from external water or particles.

A second spacer 180B can be provided on the second bank 170B. The second spacer 180B according to an embodiment can be formed of the same material as that of the first spacer 180A and be patterned and formed in a deposition process of forming the first spacer 180A. The second spacer 180B, like the second bank 170B, can be formed of a material for preventing permeation of water and can protect the routing wiring 161B from external water or particles. Also, a neutral surface in the bending area BA can be adjusted by adjusting a thickness of the second spacer 180B. The neutral surface is the central layer of the whole thickness in the bending area BA.

The coating layer 200 can be provided in a whole surface or the entire area of the bending area BA of the substrate 100 to cover the second spacer 180B. The coating layer 200 according to an embodiment can be formed of a photocurable resin and can be coated on target areas of the organic light emitting display apparatus, according to embodiments of the present disclosure. In this regard, the coating layer 200 can be coated on the whole surface of the bending area BA.

The coating layer 200 according to an embodiment can be coated to have a predetermined thickness, to adjust a neutral surface of a portion which is provided in the bending area BA of the substrate 100 in the organic light emitting display apparatus according to the present embodiment. In more detail, the neutral surface in the bending area BA of the organic light emitting display apparatus can be adjusted by the coating layer 200 so that the neutral surface can be set on the routing wiring 161B.

The contact hole CH can be provided in the interlayer insulation layer 140 and/or the planarization layer 150. The driving wiring 133 can be electrically connected to the routing wiring 161B through the contact hole CH. Since the interlayer insulation layer 140 and the planarization layer 150 are formed to cover the driving wiring 133, the contact hole CH can be provided in order for the routing wiring 161B to be electrically connected to the driving wiring 133. The contact hole CH can be formed by removing the interlayer insulation layer 140 and the planarization layer 150 overlapping a portion of the routing wiring 161B through a hole patterning process using a photolithography process and/or an etching process.

The organic light emitting display apparatus, according to an embodiment of the present disclosure, can include a wiring contact part CP.

The wiring contact part CP can be provided in a portion of the display area AA and can be an area where the driving wiring 133 is electrically connected to the routing wiring 161B. That is, the wiring contact part CP can be an area including the contact hole CH.

The contact hole CH can be provided by removing the interlayer insulation layer 140 and the planarization layer 150 overlapping a portion of the routing wiring 161B. The routing wiring 161B can be electrically connected to the driving wiring 133 through the contact hole CH. In more detail, one side of the routing wiring 161B can be provided to directly contact an upper surface of the planarization layer 150 disposed to the left of the contact hole CH, and the other side of the routing wiring 161B can be provided to directly contact an upper surface of the planarization layer 150 disposed to the right of the contact hole CH. Therefore, the routing wiring 161B can be electrically connected to the driving wiring 133 through the contact hole CH.

Here, the planarization layer 150 disposed to the left side of the contact hole CH can be a planarization layer 150 provided in the wiring contact part CP, and the planarization layer 150 disposed to the right side of the contact hole CH can be a planarization layer 150 provided in the bending area BA.

As described above, in the organic light emitting display apparatus, according to an embodiment of the present disclosure, the routing wiring 161B can be electrically connected to the driving wiring 133 through the contact hole CH, and thus, the bending process can be easily and safely performed. In more detail, in a structure of the related art, since the driving wiring 133 is formed to extend up to the driver 300, a crack may easily occur in the driving wiring 133 disposed in the bending area BA, and a short circuit may easily occur. Further, in the organic light emitting display apparatus according to an embodiment of the present disclosure, since the driving wiring 133 does not extend to the bending area BA (e.g., driving wiring 133 terminates before an edge of the bending area BA) and the routing wiring 161B is separately provided on the planarization layer 150 including an organic insulating material, a degree of damage caused by stress, tension, or other external force applied to the routing wiring 161B in the bending area BA is reduced. Accordingly, the bending process may be easily and safely performed.

Referring again to FIG. 2, the encapsulation layer 190 can be provided to cover the wiring contact part CP. That is, the encapsulation layer 190 can be provided to cover the contact hole CH and prevent permeation of external water and particles. The contact hole CH can be formed by etching the planarization layer 150, and thus, the driving wiring 133 and the thin film transistor T can be easily exposed at the outside by the contact hole CH. Therefore, in the organic light emitting display apparatus according to an embodiment of the present disclosure, the encapsulation layer 190 can be formed to seal the contact hole CH and the wiring contact part CP including the contact hole CH, and thus, the thin film transistor T can be protected from permeation of external water.

Figure 3:
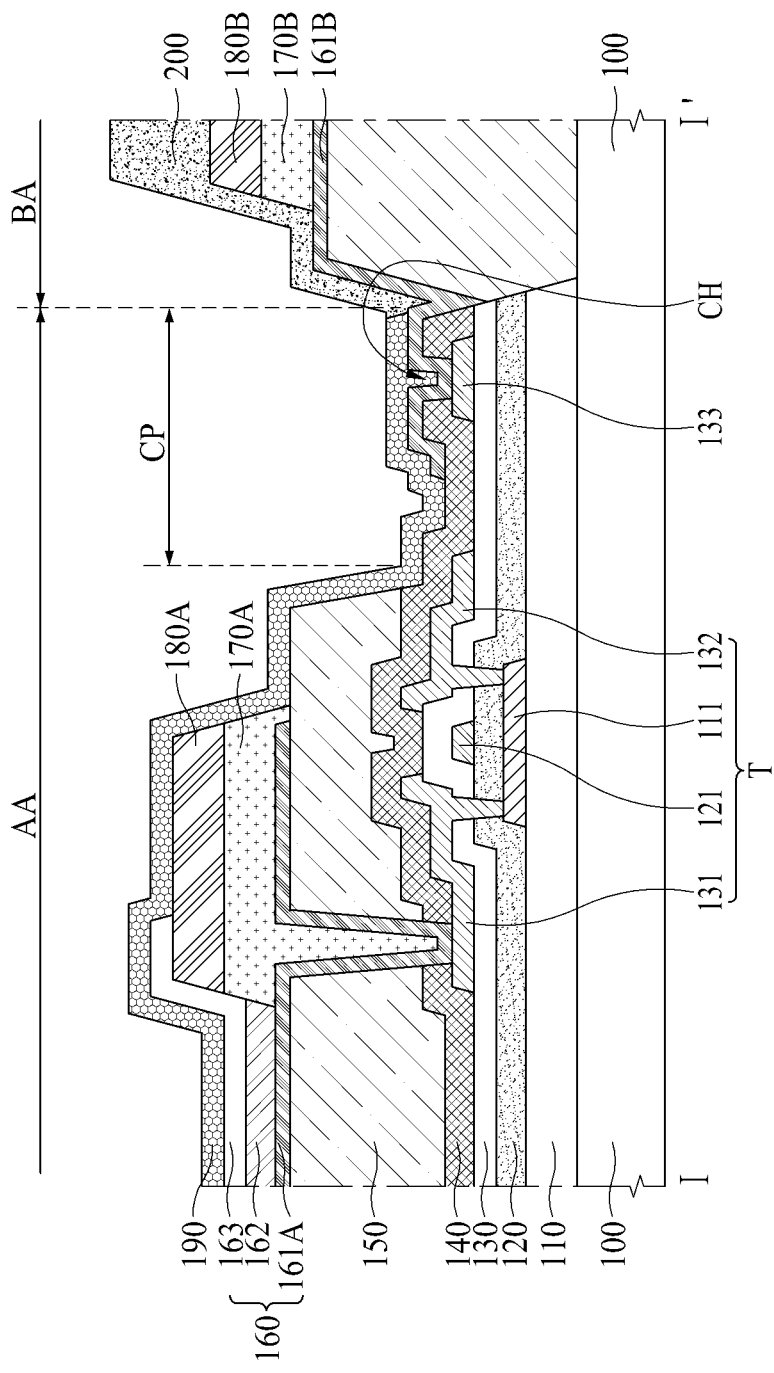
FIG. 3 is a cross-sectional view, taken along line I-I' of FIG. 1, illustrating an organic light emitting display apparatus according to another embodiment of the present disclosure.

FIG. 3 is a cross-sectional view, taken along line I-I' of FIG. 1, of an organic light emitting display apparatus according to a second embodiment of the present disclosure. Referring to FIG. 3, except for a wiring contact part CP, the organic light emitting display apparatus according to the second embodiment of the present disclosure has the same configuration as that of the organic light emitting display apparatus according to the first embodiment of the present disclosure. Therefore, the same description may not be duplicated, and a modified configuration of a wiring contact part will be described below.

Referring to FIG. 3, the organic light emitting display apparatus according to the present embodiment can include a planarization layer 150 and an encapsulation layer 190.

The planarization layer 150 can be provided on a whole region or entire area of the substrate 100, except not in a wiring contact part CP of the substrate 100. That is, the planarization layer 150 can be provided in a plurality of portions, and adjacent planarization layers 150 (e.g., adjacent portions of the planarization layer 150) can be spaced apart from each other with the wiring contact part CP disposed therebetween. Since the planarization layer 150 is not formed in the wiring contact part CP, the contact hole CH can be formed by removing an interlayer insulation layer 140 overlapping a portion of a routing wiring 161B through a hole patterning process using a photolithography process and an etching process.

Since the planarization layer 150 according to an embodiment is formed of an organic material, it is relatively difficult to etch the planarization layer 150 in comparison with an inorganic material, and a size of the contact hole CH increases (e.g., contact hole CH is wider when having to etch through the planarization layer 150). However, in the organic light emitting display apparatus according to the second embodiment of the present disclosure, since the planarization layer 150 is not formed in the wiring contact part CP, the contact hole CH can be formed by etching the interlayer insulation layer 140 including an inorganic material. Therefore, a process of forming the contact hole CH can be relatively easy, and a size of the contact hole CH can be reduced. In other words, since the interlayer insulation layer 140 is easier to etch, the contact hole CH can be made smaller. Accordingly, an aperture ratio is enhanced.

The routing wiring 161B can be electrically connected to the driving wiring 133 through the contact hole CH. In more detail, one side of the routing wiring 161B can be provided to directly contact an upper surface of the interlayer insulation layer 140 disposed to the left side of the contact hole CH, and the other side of the routing wiring 161B can be provided to directly contact an upper surface of the planarization layer 150 disposed to the right side of the contact hole CH. Therefore, the routing wiring 161B can be electrically connected to the driving wiring 133 through the contact hole CH.

Here, the interlayer insulation layer 140 disposed to the left side of the contact hole CH can be an interlayer insulation layer 140 provided in the wiring contact part CP, and the planarization layer 150 disposed to the right side of the contact hole CH can be a planarization layer 150 provided in the bending area BA.

The encapsulation layer 190 may be provided to cover a side surface of the planarization layer 150 adjacent to the wiring contact part CP. The planarization layer 150 can be provided to cover a thin film transistor T, and thus, when the side surface of the planarization layer 150 is externally exposed, external water reaches the thin film transistor T via the planarization layer 150. Accordingly, the encapsulation layer 190 according to an embodiment of the present disclosure can seal the side surface of the planarization layer 150 to protect the thin film transistor T from penetration of external water.

Figure 4:
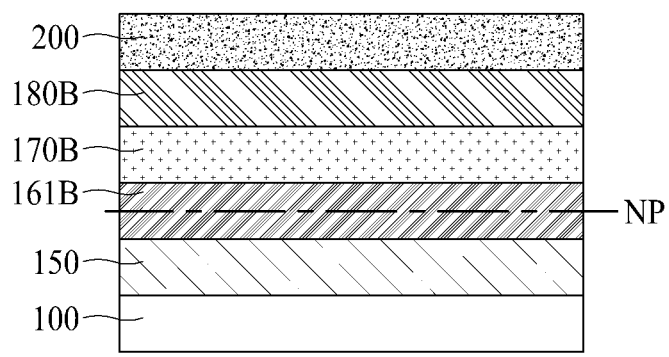
FIG. 4 is an enlarged view illustrating a structure of a bending area in an organic light emitting display apparatus according to an embodiment of the present disclosure.

FIG. 4 is an enlarged view of a structure of a bending area in an organic light emitting display apparatus according to an embodiment of the present disclosure.

Referring to FIG. 4, a neutral surface NP can be disposed in a routing wiring 161B (e.g., a conceptual plane or interface between a zone that is in compression and a zone that is in tension, where there is minimal or no lengthwise stress force on the neutral plane).

As a substrate 100 is bent, one side can be stretched, and the other side can be contracted, with respect to a specific surface. In this instance, the neutral surface NP can denote a surface which is provided in a center portion and has no contractility. Here, the neutral surface NP can denote a neutral surface of a portion which is provided in a bending area BA of the substrate 100 in the organic light emitting display apparatus according to the present embodiment. For example, the routing wiring 161B can be disposed on or near the area where a neutral surface exists in order to minimize stress on the routing wiring 161B.

In the organic light emitting display apparatus according to the present embodiment, the neutral surface NP can be adjusted through an organic layer provided in the bending area BA (e.g., the location of where the neutral surface NP exists can be changed based on how thick the coating layer 200 is made). For example, as a coating layer 200 is thickly coated, the neutral surface NP can be raised to an upper portion of the substrate 100 and can be located on the routing wiring 161B. Also, a second spacer 180B can be provided in the bending area BA, and thus, the neutral surface NP can be raised based on an influence of a thickness of the second spacer 180B, whereby the neutral surface NP can be located in a region, which is vulnerable to a stress, of the routing wiring 161B.

When the neutral surface NP is located in the routing wiring 161B, a bending stress applied to the routing wiring 161B is minimized, and thus, a stress is minimized. Also, a crack does not occur in maximum bending, and thus, the bending process of the organic light emitting display apparatus may be easily and safely performed. In other words, the routing wiring 161B is arranged so that it exists in the neutral surface when the substrate is bent (e.g., the safest place or area that experiences the least amount of bending stress).

As described above, the organic light emitting display apparatus according to the embodiments of the present disclosure enables bending to be easily performed and effectively protects a light emitting device from penetration of external water.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus comprising:
a substrate including a display area and a bending area;
a pixel array layer including a driving wiring in the display area, and a thin film transistor electrically connected to the driving wiring;
a planarization layer covering the pixel array layer;
a light emitting device layer disposed on the planarization layer, the light emitting device layer being electrically connected to the thin film transistor,
a routing wiring disposed in the bending area, the routing wiring being electrically connected to the driving wiring;
a wiring contact part including a contact hole for electrically connecting the driving wiring to the routing wiring;
an encapsulation layer covering the light emitting device layer and the wiring contact part;
a first bank disposed between the planarization layer and the encapsulation layer to define an emission area in the display area;
a second bank disposed on the routing wiring in the bending area;
a first spacer disposed between the first bank and the encapsulation layer; and
a second spacer disposed on the second bank,
wherein the encapsulation layer covers a side surface of the first bank adjacent to the wiring contact part,
wherein the encapsulation layer covers a side surface of the first spacer adjacent to the wiring contact part, and
wherein the encapsulation layer fills a portion of the contact hole above the routing wiring and terminates before an edge of the bending area.

2. The organic light emitting display apparatus of claim 1, wherein the routing wiring directly contacts the driving wiring in the contact hole of the wiring contact part.

3. The organic light emitting display apparatus of claim 1, wherein the light emitting device layer comprises:
a first electrode disposed on the planarization layer, the first electrode being electrically connected to the thin film transistor;
a light emitting layer disposed on the first electrode; and
a second electrode disposed on the light emitting layer,
wherein the routing wiring and the first electrode both comprise a same material.

4. The organic light emitting display apparatus of claim 1, wherein the planarization layer is additionally disposed in the bending area, and
wherein the routing wiring is disposed on the planarization layer in the bending area.

5. The organic light emitting display apparatus of claim 4, further comprising:
an interlayer insulation layer covering the driving wiring,
wherein the contact hole extends through the interlayer insulation layer.

6. The organic light emitting display apparatus of claim 5, wherein one side of the routing wiring directly contacts an upper surface of the planarization layer in the wiring contact part, and
wherein another side of the routing wiring directly contacts an upper surface of the planarization layer in the bending area.

7. The organic light emitting display apparatus of claim 5, wherein one side of the routing wiring directly contacts an upper surface of the interlayer insulation layer, and
wherein another side of the routing wiring directly contacts an upper surface of the planarization layer in the bending area.

8. The organic light emitting display apparatus of claim 1, further comprising:
a coating layer disposed on the second spacer.

9. The organic light emitting display apparatus of claim 8, wherein a neutral surface of the bending area is disposed in the routing wiring.

10. The organic light emitting display apparatus of claim 9, wherein a thickness of the coating layer is configured to adjust the neutral surface of the bending area to be centered on the routing wiring for reducing stress on the routing wiring.

11. The organic light emitting display apparatus of claim 1, wherein the muting wiring directly contacts an upper surface of the planarization layer on opposite sides of the contact hole in the wiring contact part.

12. The organic light emitting display apparatus of claim 1, further comprising:
an interlayer insulation layer disposed on the driving wiring,
wherein the contact hole extends through the interlayer insulation layer, and
wherein the routing wiring directly contacts an upper surface of the interlayer insulation layer on opposite sides of the contact hole in the wiring contact part.

13. The organic light emitting display apparatus of claim 1, wherein a lowermost surface of the planarization layer directly contacts an uppermost surface of the substrate in the bending area,
wherein a side surface of the planarization layer directly contacts the routing wiring in the bending area, and
wherein an uppermost surface of the planarization layer directly contacts a lower surface of the routing wiring in the bending area.

14. The organic light emitting display apparatus of claim 1, wherein the planarization layer is absent from the wiring contact part, and
wherein the encapsulation layer overlaps with the routing wiring in the contact part.

15. An organic light emitting display apparatus comprising:
a substrate including a display area and a bending area;
a driving wiring in the display area and a thin film transistor electrically connected to the driving wiring;
a planarization layer disposed in the display area;
a routing wiring disposed in the bending area, the routing wiring being electrically connected to the driving wiring;
a wiring contact part including a contact hole for electrically connecting the driving wiring to the routing wiring;
an encapsulation layer covering the display area and the wiring contact part;
a first bank disposed between the planarization layer and the encapsulation layer to define an emission area in the display area;
a second bank disposed on the routing wiring in the bending area;
a first spacer disposed between the first bank and the encapsulation layer; and
a second spacer disposed on the second bank,
wherein a portion of the planarization layer is disposed between the routing wiring and the substrate in the bending area,
wherein the encapsulation layer covers a side surface of the first bank adjacent to the wiring contact part,
wherein the encapsulation layer covers a side surface of the first spacer adjacent to the wiring contact part, and
wherein the encapsulation layer fills a portion of the contact hole above the routing wiring and terminates before an edge of the bending area.

16. The organic light emitting display apparatus of claim 15, wherein an upper surface of the portion of the planarization layer directly contacts a lower surface of the routing wiring in the bending area, and
wherein a lower surface of the portion of the planarization layer directly contacts an upper surface of the substrate in the bending area.

17. The organic light emitting display apparatus of claim 15, wherein the routing wiring is disposed on opposite sides of the contact hole in the wiring contact part.

18. An organic light emitting display apparatus comprising:
a substrate including a display area and a bending area;
a pixel array layer including a driving wiring in the display area, and a thin film transistor electrically connected to the driving wiring;
a planarization layer disposed on the pixel array layer;
a light emitting device layer disposed on the planarization layer, the light emitting device layer being electrically connected to the thin film transistor;
a routing wiring disposed in the bending area, the routing wiring being electrically connected to the driving wiring;
a contact hole for electrically connecting the driving wiring to the routing wiring;
an encapsulation layer covering the light emitting device layer;
a first bank disposed between the planarization layer and the encapsulation layer to define an emission area in the display area;
a second bank disposed on the routing wiring in the bending area;
a first spacer disposed between the first bank and the encapsulation layer; and
a second spacer disposed on the second bank,
wherein a portion of the planarization layer is disposed between the routing wiring and the substrate in the bending area,
wherein a side surface of the portion of the planarization layer directly contacts the routing wiring,
wherein the encapsulation layer covers a side surface of the first bank adjacent to the wiring contact part,
wherein the encapsulation layer covers a side surface of the first spacer adjacent to the wiring contact part, and
wherein the encapsulation layer fills a portion of the contact hole above the routing wiring and terminates before an edge of the bending area.

19. The organic light emitting display apparatus of claim 8, wherein the coating layer directly contacts the encapsulation layer.

20. The organic light emitting display apparatus of claim 8, wherein the encapsulation layer completely fills the contact hole above the routing wiring.